United States Patent [19]

Barou

[11] Patent Number: 5,404,097
[45] Date of Patent: Apr. 4, 1995

[54] VOLTAGE TO CURRENT CONVERTER WITH NEGATIVE FEEDBACK

[75] Inventor: Michel Barou, Voreppe, France

[73] Assignee: SGS-Thomson Microelectronics S.A., Gentilly, France

[21] Appl. No.: 115,874

[22] Filed: Sep. 1, 1993

[30] Foreign Application Priority Data

Sep. 7, 1992 [FR] France ............... 92 11061

[51] Int. Cl.6 ............... G05F 3/04; H03F 3/45
[52] U.S. Cl. ................. 323/312; 323/315; 330/260
[58] Field of Search ......... 323/312, 315, 316; 330/252, 254, 257, 259, 260

[56] References Cited

U.S. PATENT DOCUMENTS

| | | | |
|---|---|---|---|
| 4,422,051 | 12/1983 | Katakura et al. | 330/260 |
| 4,523,153 | 6/1985 | Itoh | 330/254 |
| 4,539,491 | 9/1985 | Nishioka et al. | 307/297 |
| 4,667,166 | 5/1987 | Itoh | 330/260 |
| 4,748,422 | 5/1988 | Metz | 330/149 |
| 4,774,476 | 9/1988 | Ecklund et al. | 330/260 |
| 4,952,866 | 8/1990 | Van Tuijl | 323/315 |
| 5,115,206 | 5/1992 | Mack et al. | 330/260 |
| 5,216,382 | 6/1993 | Ito | 330/260 |

FOREIGN PATENT DOCUMENTS 2223902  4/1990  United Kingdom ............... 330/260

Primary Examiner—Steven L. Stephan
Assistant Examiner—Matthew V. Nguyen
Attorney, Agent, or Firm—Wolf, Greenfield & Sacks

[57] ABSTRACT

A voltage/current converter includes a first differential pair including a first and second NPN transistor, a second differential pair including a third and fourth NPN transistor, a first resistor disposed between the emitters of the transistors of the first differential pair, a second resistor disposed between the emitters of the transistors of the second differential pair, third and fourth resistors disposed between the bases of the first and third transistors and of the second and fourth transistors, respectively, and a voltage negative feedback means disposed between the terminals of the second resistor and the bases of the transistors of the first differential pair in order to fix the voltage across the second resistor to a predetermined input voltage.

40 Claims, 3 Drawing Sheets

VOLTAGE TO CURRENT CONVERTER WITH NEGATIVE FEEDBACK

BACKGROUND OF THE INVENTION

1. Field of the Invention

The present invention relates to circuits providing a current proportional to an input voltage, and more particularly to such a circuit that can be easily fabricated in the form of an integrated circuit.

2. Discussion of the Related Art

FIG. 1 schematically shows a circuit conventionally used for voltage/current conversion. Such circuit includes two NPN-type bipolar transistors, Q1 and Q2, having their collectors connected to a high voltage VCC and their emitters connected to a low voltage VEE through current sources I. Emitters are interconnected through a resistor R1. The collector currents of these transistors are referenced IC1 and IC2. The voltage Ve to be converted into a current is applied between the bases B1 and B2 of transistors Q1 and Q2. Thus, the voltage V(R1) across R1 is:

$$V(R1) = Ve \, (Vbe2 - Vbe1).$$

The current $\Delta I$ in resistor R1 is $\Delta I = V(R1)/R1$. The emitter current of Q1 is $I + \Delta I$, and the emitter current of Q2 is $I - \Delta I$. Assuming that the base-emitter voltage drops Vbe1 and Vbe2 of transistors Q1 and Q2 are equal, and that the difference of the emitter currents is equal to the difference of the collector currents, then $IC1 - IC2 = 2\Delta I = 2Ve/RI$.

A conventional circuit 10, for example of the current mirror type, provides the difference between currents IC1 and IC2 and provides at the output a current $2\Delta I$ that is proportional to Ve.

In the above discussion, two simplified assumptions have been considered. The first assumption is that Vbe1 = Vbe2; the second assumption is that the difference in the emitter currents is equal to the difference of the collector currents. In fact, the collector currents of transistors Q1 and Q2 are $IC1 = \alpha(I + \Delta I)$ and $IC2 = \alpha(I - \Delta I)$, where $\alpha$ is the common-base current gain of transistors Q1 and Q2 (it is assumed that the two transistors have the same gain). $\alpha$ is expressed as a function of the common-emitter current gain, $\beta$, of transistors Q1 and Q2 by the relation $\alpha = 1/(1 + 1/\beta)$. Thus, current $\Delta I$, instead of being simply equal to Ve/R1 is in fact expressed by the relation:

$$\Delta I = \alpha[Ve + (Vbe2 - Vbe1)]/R1.$$

Thus, a first error is due to the value of Vbe2 − Vbe1 that is non-zero and varies with the current and temperature. The second error is due to the fact that $\alpha$ is not equal to 1, and the variation of $\alpha$ can be non-negligible when $\beta$ is relatively low. For example, if $\beta = 35$, $\alpha$ is equal to 0.97; so, the proportion error is approximately 3%.

A conventional manner to correct the first error is illustrated in FIG. 2. A negative feedback is imposed between the emitter and the base of each transistor Q1 and Q2 through differential amplifiers A1 and A2 whose outputs are applied to the bases of transistors Q1 and Q2, respectively, and whose inverting inputs are connected to the emitters of transistors Q1 and Q2, respectively. The input signal is applied between the non-inverting inputs E1 and E2 of amplifiers A1 and A2. Thus, the error associated with the non-zero value of Vbe2 − Vbe1 is attenuated by a factor AV, where AV is the voltage gain of each amplifier A. This gain can be very high, for example higher than 100, and the slight error in the difference of the base-emitter voltages thus becomes an error of the second order, substantially lower than 1:1000.

A conventional method to correct the second error is to substitute a Darlington-type circuit for each transistor Q1 and Q2. As is shown in FIG. 3, each transistor Q1 and Q2 is associated with a respective Darlington-connected transistor Q'1 and Q'2. Considering that transistors Q1, Q2, Q'1 and Q'2 have the same common-emitter current gain, $\beta$, the common-base current gains $\alpha$ become $1[1 + 1/\beta(\beta + 1)]$. Again, an error of the first order is changed into an error of the second order, that becomes negligible.

Thus, the circuit of FIG. 3 that combines the correction means of the first and second type of error is satisfactory and provides currents IC1 and IC2 whose difference is proportional (the proportion ratio being associated with the value of resistor R1) to the difference in voltage between terminals E1 and E2.

However, this circuit has a drawback inherent in the presence of a Darlington-type circuit. Indeed, when considering a single transistor such as transistor Q1 or Q2, its collector/emitter voltage drop at the conducting state, Vsat, is approximately 0.2 volt. Whereas, in the case of a Darlington circuit, this voltage drop is increased by the mean value of a base-emitter voltage drop, that is, the total voltage drop approaches a value of approximately 1 volt. This phenomenon is aggravated at low temperatures where Vbe increases. This relatively high voltage drop across the transistors is a drawback especially due to the fact that, as illustrated in FIG. 1, there are additional transistor stages between the high supply voltage and the low supply voltage (between VCC and VEE). This requires that the difference VCC − VEE must be higher in the case of the circuit of FIG. 3 than in the case of the circuit of FIG. 1 and does not allow the use of the circuit of FIG. 3 when this voltage difference (supply voltage) is low.

SUMMARY OF THE INVENTION

An object of the invention is to provide a voltage/current converter in which the voltage drop across the elements providing the current is as low as possible.

To achieve this object, the invention provides a circuit for converting a voltage into a current difference, including a first differential pair including a first and second NPN transistor whose emitters are connected to a low supply terminal through a current source and whose collectors are connected to a high supply terminal, a second differential pair including a third and fourth NPN transistor whose emitters are connected to a low supply terminal through a current source and whose collectors are connected to a high supply terminal, a first resistor disposed between the emitters of the transistors of the first pair, a second resistor disposed between the emitters of the transistors of the second pair, third and fourth resistors disposed between the bases of the first and third transistors and of the second and fourth transistors, respectively, and a voltage negative feedback means disposed across the second resistor and the bases of the transistors of the first pair in order to fix the voltage across the second resistor to a predetermined input voltage.

According to an embodiment of the invention, the negative feedback means includes operational amplifiers, each having a first input connected to a terminal of the second resistor, a second input forming an input terminal, and an output applied to the base of a transistor of the first pair.

According to an embodiment of the invention, each operational amplifier is formed by a fifth NPN transistor and a sixth PNP transistor, the base of the fifth transistor being connected to a terminal of the second resistor, the emitter of the fifth transistor being connected to the input terminal, the collector of the fifth transistor being connected to the high supply terminal through a current source, the base of the sixth transistor being connected to the collector of the fifth transistor, the emitter of the sixth transistor being connected to the high supply terminal through a current source and to the base of a transistor of the first differential pair, and the collector of the sixth transistor being connected to the low supply terminal.

According to an embodiment of the invention, an operational amplifier is formed by an NPN transistor whose collector is connected to the high supply terminal through a current source and to the base of a transistor of the first pair, having its emitter connected to a second input terminal and its base connected both to a first input terminal and a terminal of the second resistor.

According to an embodiment of the invention, the third and fourth resistors have a same value, equal to half the value of the second resistor.

The foregoing and other objects, features, aspects and advantages of the invention will become apparent from the following detailed description of the present invention when taken in conjunction with the accompanying drawings.

DETAILED DESCRIPTION

Figure 4:
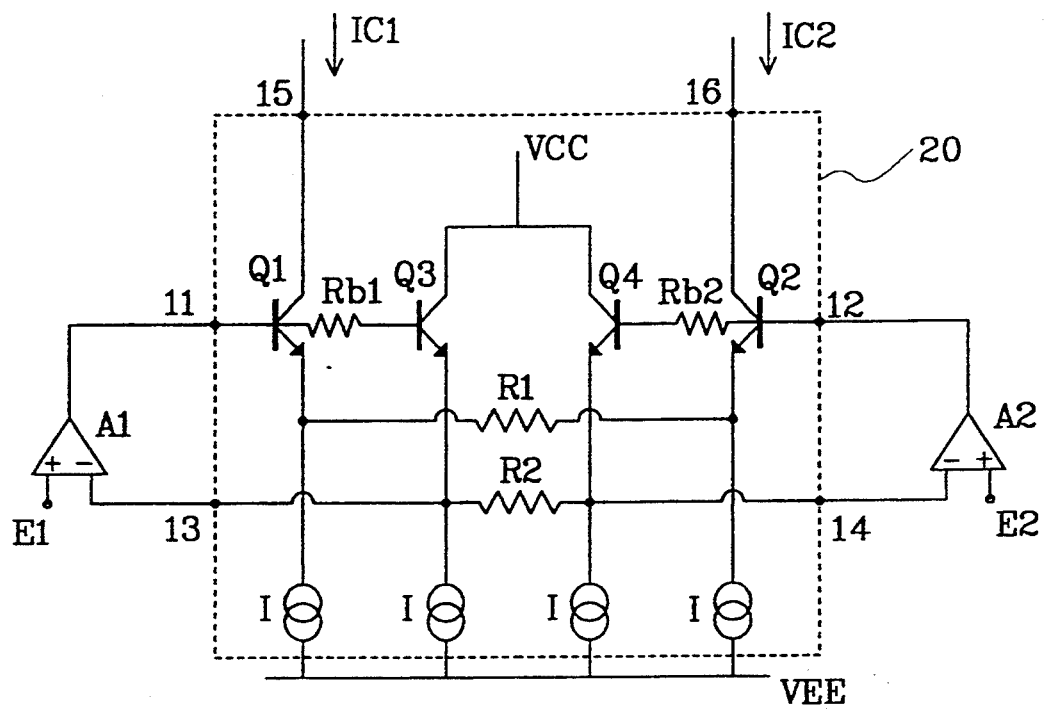
FIG. 4 schematically shows a first embodiment of the circuit according to the invention operable for converting a voltage into a current.

FIG. 4 schematically shows an embodiment of a circuit according to the invention. The circuit includes a first differential pair including transistors Q1 and Q2 and a second differential pair including transistors Q3 and Q4. In the represented embodiment, all the transistors are of the NPN-type. The emitters of transistors Q1–Q4 are connected to the low supply terminal VEE through current sources I. The collectors of transistors Q1–Q4 are connected to a high supply terminal VCC, directly or indirectly but in both cases through paths having the same impedance for each transistor of a differential pair. The emitters of transistors Q1 and Q2 are connected through a resistor R1 and the emitters of transistors Q3 and Q4 are connected through a resistor R2. The outputs of the operational amplifiers A1 and A2 are connected to the bases of transistors Q1 and Q2, respectively. The inverting inputs of amplifiers A1 and A2 are connected to the emitters of transistors Q3 and Q4, respectively, and the non-inverting inputs E1 and E2 of amplifiers A1 and A2 correspond to input terminals between which is applied the voltage that is to be converted into a current, the converted current being proportional to the difference between the collector currents IC1 and IC2 of transistors Q1 and Q2. The bases of transistors Q1 and Q3 and the bases of transistors Q2 and Q4 are respectively connected through connecting resistors Rb1 and Rb2 having an equal value, Rb.

For the sake of simplification of the description, references 11 and 12 designate the base terminals of transistors Q1 and Q2, 13 and 14 designate the emitter terminals of transistors Q3 and Q4, and 15 and 16 designate the collector terminals of transistors Q1 and Q2. Terminals 11–16 are the input/output terminals of a block surrounded by dashed lines and referenced 20 in FIG. 4.

Figure 1:
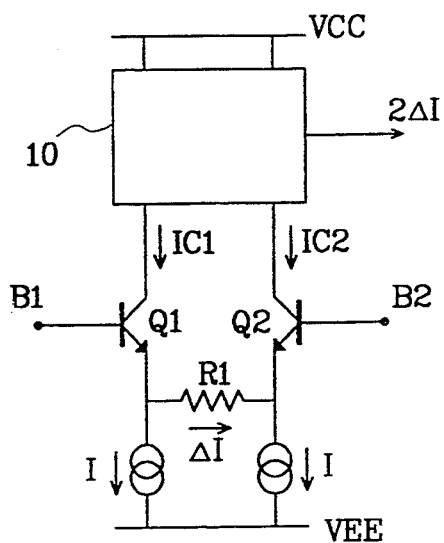
FIGS. 1-3, above described, are useful for illustrating the state of the art.
Figure 2:
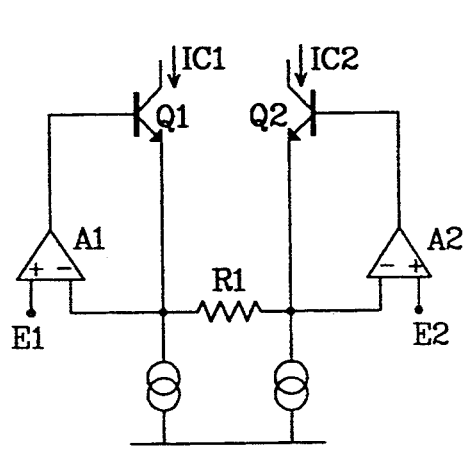
Figure 3:
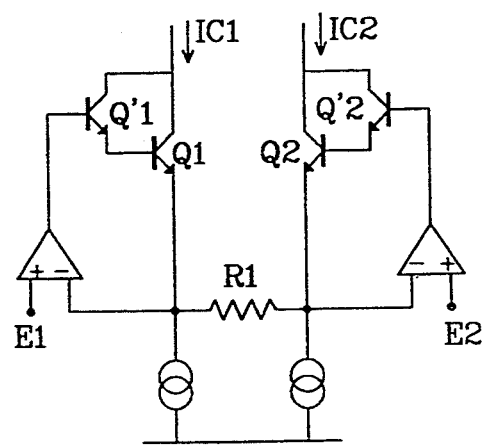

In the case of FIGS. 2 and 3, because of the presence of the high gain operational amplifiers A1 and A2, voltage Ve appears across resistor R1 between inputs E1 and E2. Similarly, in the example of FIG. 4, voltage Ve appears across resistor R2. Current IR2 in resistor R2 is equal to Ve/R2 virtually without error or with a negligible error of the second order. Currents I+IR2 and I−IR2 appear again in the emitters of transistors Q3 and Q4. The differential voltage between the bases of transistors Q1 and Q2 is also differentially applied to the bases of transistors Q3 and Q4, with a resulting voltage difference across resistor R1 (neglecting the errors in differences of Vbe that are, in that case, of the second order):

$$V(R1) = Ve + 2Rb.IR2/\beta$$

or $$V(R1) = Ve(1 + 2Rb/\beta R2).$$

The difference in the collector current of transistors Q1 and Q2 is equal to twice the current value in resistor R1 multiplied by the gain ratio $\alpha$ ($\approx 1 - 1/\beta$). Thus, by selecting Rb=R2/2, one obtains:

$$IC1 - IC2 = (2Ve/R1)(1 + 1/\beta)(1 - 1/\beta)$$

that is, $$IC1 - IC2 = (2Ve/R1)(1 - 1/\beta^2)$$

that is, the $1/\beta^2$ term being negligible, this current difference becomes substantially equal to 2Ve/R1 and, as desired, is proportional to voltage Ve. This result is obtained whereas the voltage across transistors Q1 and Q2 remains the voltage drop at the conduction state of a bipolar transistor that is, as indicated above, approximately 0.2 volt.

Like in conventional circuits, the proportion ratio between the voltage and the current depends only on the value of resistor R1. The values of resistors R2, Rb1 and Rb2 intervene only by their ratio that can be extremely accurate in an integrated circuit device.

Of course, those skilled in the art can devise various modifications to the circuit according to the invention.

Figure 5:
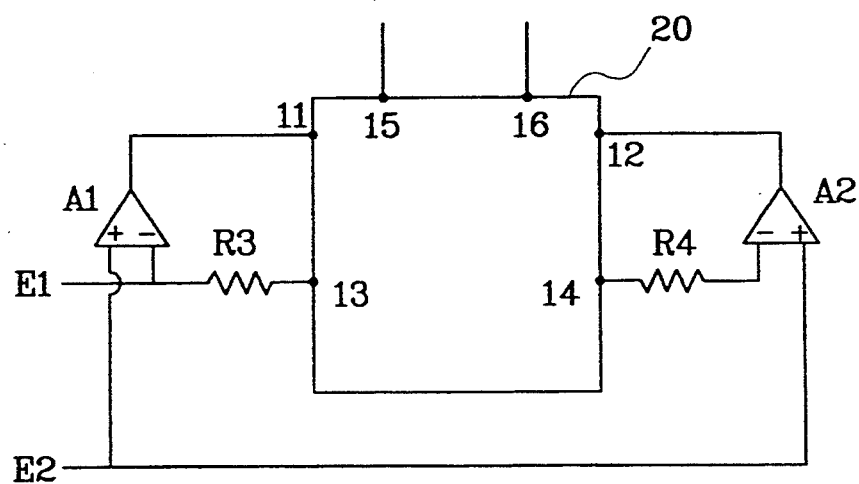
FIG. 5 represents a variant of the circuit of FIG. 4.

FIG. 5 shows a variant in which the connection mode of the operational amplifier A1 and A2 is modified. FIG. 5 shows again the block 20 of FIG. 4 with its terminals 11–16. In FIG. 5, the inverting inputs of the operational amplifiers A1 and A2 are connected to terminals 13 and 14 through respective resistors R3 and R4, and the non-inverting inputs are interconnected. The input terminals E1 and E2 then correspond to the inverting input of amplifier A1 and to the non-inverting inputs of amplifiers A1 and A2. In this case, a voltage can be applied between inputs E1 and E2 with interposition of a series resistor on terminal E1 in a manner known by those skilled in the art.

Figure 6:
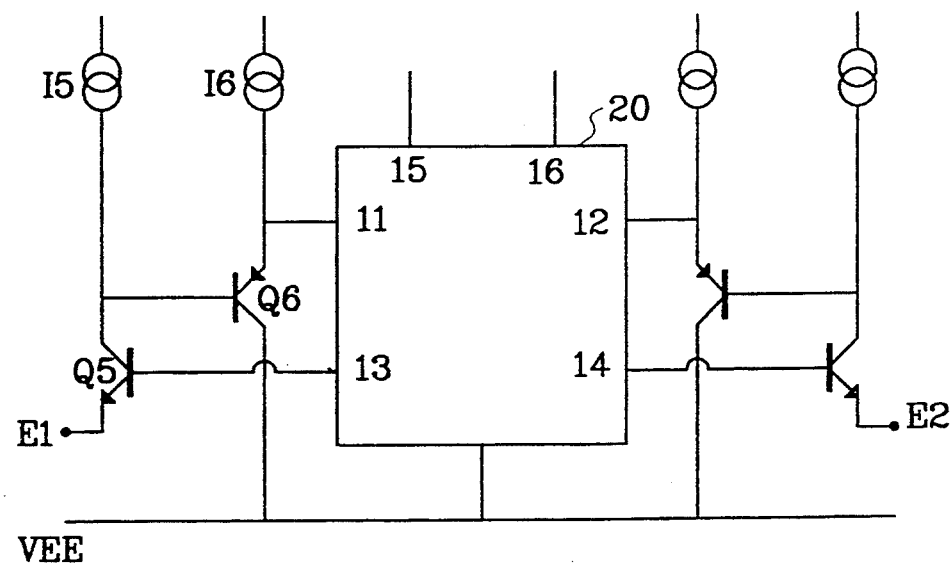
FIGS. 6 and 7 represent in more detail implementations of negative feedback amplifiers used in FIGS. 4 and 5, respectively.

FIG. 6 shows an exemplary embodiment of operational amplifiers used for the circuit of FIG. 4. Amplifier A1 only will be described in detail, since amplifier A2 is identical. Amplifier A1 is formed by an NPN-type transistor Q5 and a PNP-type transistor Q6. The collector of transistor Q5 is connected to the high supply terminal through a current source 15. The emitter of transistor Q6 is connected to terminal 11 and to the high supply terminal through a current source 16. The base of transistor Q6 is connected to the collector of transistor Q5. The collector of transistor Q6 is connected to the low supply terminal VEE. The base of transistor Q5 is connected to terminal 13. The emitter of transistor Q5 corresponds to the input terminal E1.

Figure 7:
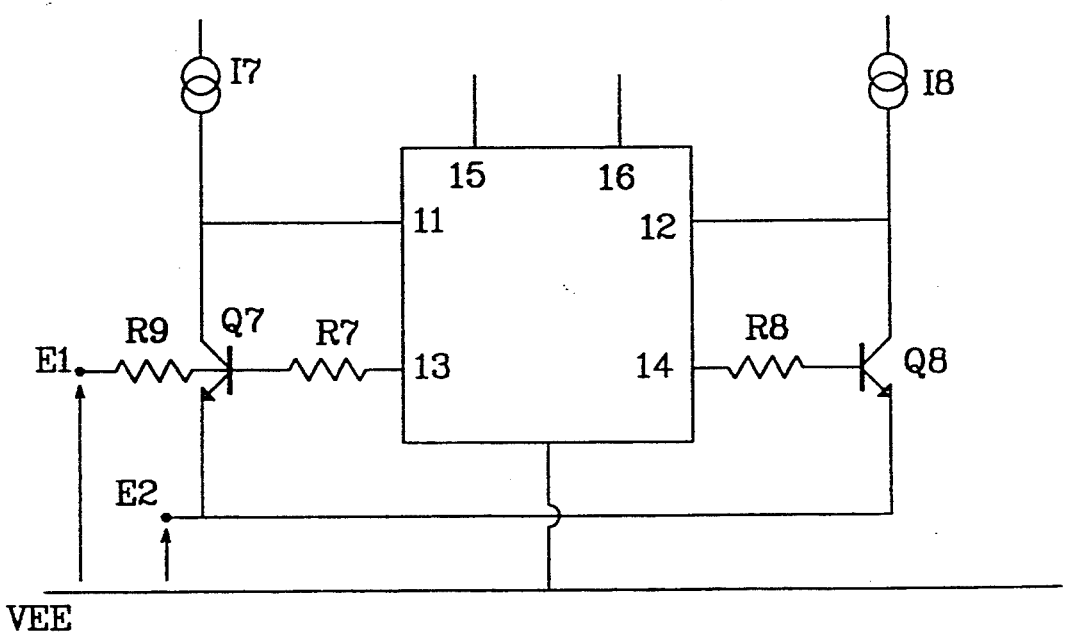

FIG. 7 shows an exemplary embodiment of the operational amplifiers A1 and A2 used in a circuit as the one shown in FIG. 5. The operational amplifiers A1 and A2 are formed by NPN-type transistors Q7 and Q8, respectively. The collectors are respectively connected to terminals 11 and 12 and to the high supply terminal through respective current sources 17 and 18. The emitters are interconnected and form the input terminal E2. The bases of transistors Q7 and Q8 are respectively connected to terminals 13 and 14 through resistors R7 and R8. As indicated above, the input terminal E1 is preferably connected to the base of transistor Q7 through a resistor R9.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A circuit for converting a voltage into a current difference, including:
   a first differential pair including first and second NPN transistors each having an emitter coupled to a low supply terminal through first and second current sources, respectively, and each transistor having a collector coupled to a high supply terminal;
   a second differential pair including third and fourth NPN transistors each having an emitter coupled to the low supply terminal through third and fourth current sources, respectively, and each having a collector coupled to the high supply terminal;
   a first resistor disposed between the emitters of the transistors of the first differential pair;
   a second resistor disposed between the emitters of the transistors of the second differential pair;
   third and fourth resistors disposed between bases of the first and third transistors and of the second and fourth transistors, respectively; and
   voltage negative feedback means disposed between the terminals of the second resistor and the bases of the transistors of the first differential pair for fixing the voltage across the second resistor to a predetermined input voltage.

2. The circuit of claim 1, wherein the negative feedback means includes operational amplifiers, each having a first input connected to a terminal of the second resistor, a second input forming an input terminal, and an output connected to the base of one of the transistors of the first differential pair.

3. A circuit for converting a voltage into a current difference, including:
   a first differential pair including first and second NPN transistors each having an emitter coupled to a low supply terminal through first and second current sources, respectively, and each transistor having a collector coupled to a high supply terminal;
   a second differential pair including third and fourth NPN transistors each having an emitter coupled to the low supply terminal through third and fourth current sources, respectively, and each having a collector coupled to the high supply terminal;
   a first resistor disposed between the emitters of the transistors of the first differential pair;
   a second resistor disposed between the emitters of the transistors of the second differential pair;
   third and fourth resistors disposed between bases of the first and third transistors and of the second and fourth transistors, respectively; and
   a voltage negative feedback means disposed between the terminals of the second resistor and the bases of the transistors of the first differential pair for fixing the voltage across the second resistor to a predetermined input voltage;
   wherein the negative feedback means includes first and second operational amplifiers and fifth and sixth resistors, the first operational amplifier having a first input connected to a first terminal of the second resistor via the fifth resistor, the second operational amplifier having a first input connected to a second terminal of the second resistor via the sixth resistor, the first and second operational amplifiers each having a second input connected to an input terminal and an output connected to the base of one of the transistors of the first differential pair.

4. The circuit of claim 3, wherein the negative feedback means further includes a seventh resistor, and wherein the second input of the first operational amplifier is connected to one of the input terminals via the seventh resistor.

5. A circuit for converting a voltage into a current difference, including:
   a first differential pair including first and second NPN transistors each having an emitter coupled to a low supply terminal through first and second current sources, respectively, and each transistor having a collector coupled to a high supply terminal;
   a second differential pair including third and fourth NPN transistors each having an emitter coupled to the low supply terminal through third and fourth current sources, respectively, and each having a collector coupled to the high supply terminal;
   a first resistor disposed between the emitters of the transistors of the first differential pair;
   a second resistor disposed between the emitters of the transistors of the second differential pair;
   third and fourth resistors disposed between bases of the first and third transistors and of the second and fourth transistors, respectively; and a voltage negative feedback means disposed between the terminals of the second resistor and the bases of the transistors of the first differential pair for fixing the voltage across the second resistor to a predetermined input voltage;

wherein the negative feedback means includes operational amplifiers, each having a first input connected to a terminal of the second resistor, a second input forming an input terminal, and an output connected to the base of a transistor of the first differential pair; and wherein each operational amplifier is formed by a fifth NPN transistor and a sixth PNP transistor, the base of the fifth transistor being connected to a terminal of the second resistor, the emitter of the fifth transistor being connected to the input terminal, the collector of the fifth transistor being connected to the high supply terminal through a current source, the base of the sixth transistor being connected to the collector of the fifth transistor, the emitter of the sixth transistor being connected to the high supply terminal through a current source and to the base of the transistor of the first differential pair, and the collector of the sixth transistor being connected to the low supply terminal.

6. A circuit for converting a voltage into a current difference, including:

a first differential pair including first and second NPN transistors each having an emitter coupled to a low supply terminal through first and second current sources, respectively, and each transistor having a collector coupled to a high supply terminal;

a second differential pair including third and fourth NPN transistors each having an emitter coupled to the low supply terminal through third and fourth current sources, respectively, and each having a collector coupled to the high supply terminal;

a first resistor disposed between the emitters of the transistors of the first differential pair;

a second resistor disposed between the emitters of the transistors of the second differential pair;

third and fourth resistors disposed between bases of the first and third transistors and of the second and fourth transistors, respectively; and a voltage negative feedback means disposed between the terminals of the second resistor and the bases of the transistors of the first differential pair for fixing the voltage across the second resistor to a predetermined input voltage;

wherein the negative feedback means includes operational amplifiers, each having a first input connected to a terminal of the second resistor, a second input forming an input terminal, and an output connected to the base of a transistor of the first differential pair; and wherein one of the operational amplifiers is formed by a further NPN transistor having a collector connected to the high supply terminal through a current source and to the base of one of the transistors of the first differential pair, having an emitter connected to a second input terminal and having a base connected both to one of the first input terminals and to one of the terminals of the second resistor.

7. The circuit of claim 6, wherein the negative feedback means further includes a fifth resistor, and wherein the base of the further transistor is connected to the one of the first input terminals via the fifth resistor.

8. The circuit of claim 1, wherein the third and fourth resistors have a same value that is equal to half the value of the second resistor.

9. A circuit for converting a voltage into a current difference, including:

a first differential pair including first and second NPN transistors each having an emitter coupled to a low supply terminal through first and second current sources, respectively, and each transistor having a collector coupled to a high supply terminal;

a second differential pair including third and fourth NPN transistors each having an emitter coupled to the low supply terminal through third and fourth current sources, respectively, and each having a collector coupled to the high supply terminal;

a first resistor disposed between the emitters of the transistors of the first differential pair;

a second resistor disposed between the emitters of the transistors of the second differential pair;

third and fourth resistors disposed between bases of the first and third transistors and of the second and fourth transistors, respectively; and a voltage negative feedback circuit disposed between the terminals of the second resistor and the bases of the transistors of the first differential pair.

10. The circuit of claim 9, wherein the negative feedback circuit includes operational amplifiers, each having a first input coupled to a terminal of the second resistor, a second input forming an input terminal, and an output coupled to the base of one of the transistors of the first differential pair.

11. A circuit for converting a voltage into a current difference, including:

a first differential pair including first and second NPN transistors each having an emitter coupled to a low supply terminal through first and second current sources, respectively, and each transistor having a collector coupled to a high supply terminal;

a second differential pair including third and fourth NPN transistors each having an emitter coupled to the low supply terminal through third and fourth current sources, respectively, and each having a collector coupled to the high supply terminal;

a first resistor disposed between the emitters of the transistors of the first differential pair;

a second resistor disposed between the emitters of the transistors of the second differential pair;

third and fourth resistors disposed between bases of the first and third transistors and of the second and fourth transistors, respectively; and a voltage negative feedback circuit disposed between the terminals of the second resistor and the bases of the transistors of the first differential pair;

wherein the negative feedback circuit includes first and second operational amplifiers and fifth and sixth resistors, the first operational amplifier having a first input coupled to a first terminal of the second resistor via the fifth resistor, the second operational amplifier having a first input coupled to a second terminal of the second resistor via the sixth resistor, the first and second operational amplifiers each having a second input coupled to an input terminal and an output coupled to the base of one of the transistors of the first differential pair.

12. The circuit of claim 11, wherein the negative feedback circuit further includes a seventh resistor, and wherein the second input of the first operational amplifier is coupled to one of the input terminals via the seventh resistor.

13. A circuit for converting a voltage into a current difference, including:
- a first differential pair including first and second NPN transistors each having an emitter coupled to a low supply terminal through first and second current sources, respectively, and each transistor having a collector coupled to a high supply terminal;
- a second differential pair including third and fourth NPN transistors each having an emitter coupled to the low supply terminal through third and fourth current sources, respectively, and each having a collector coupled to the high supply terminal;
- a first resistor disposed between the emitters of the transistors of the first differential pair;
- a second resistor disposed between the emitters of the transistors of the second differential pair;
- third and fourth resistors disposed between bases of the first and third transistors and of the second and fourth transistors, respectively; and
- a voltage negative feedback circuit disposed between the terminals of the second resistor and the bases of the transistors of the first differential pair;
- wherein the negative feedback circuit includes operational amplifiers, each having a first input coupled to a terminal of the second resistor, a second input forming an input terminal, and an output coupled to the base of a transistor of the first differential pair; and
- wherein each operational amplifier is formed by a fifth NPN transistor and a sixth PNP transistor, the base of the fifth transistor being coupled to a terminal of the second resistor, the emitter of the fifth transistor being coupled to the input terminal, the collector of the fifth transistor being coupled to the high supply terminal through a current source, the base of the sixth transistor being coupled to the collector of the fifth transistor, the emitter of the sixth transistor being coupled to the high supply terminal through a current source and to the base of a transistor of the first differential pair, and the collector of the sixth transistor being coupled to the low supply terminal.

14. A circuit for converting a voltage into a current difference, including:
- a first differential pair including first and second NPN transistors each having an emitter coupled to a low supply terminal through first and second current sources, respectively, and each transistor having a collector coupled to a high supply terminal;
- a second differential pair including third and fourth NPN transistors each having an emitter coupled to the low supply terminal through third and fourth current sources, respectively, and each having a collector coupled to the high supply terminal;
- a first resistor disposed between the emitters of the transistors of the first differential pair;
- a second resistor disposed between the emitters of the transistors of the second differential pair;
- third and fourth resistors disposed between bases of the first and third transistors and of the second and fourth transistors, respectively; and
- a voltage negative feedback circuit disposed between the terminals of the second resistor and the bases of the transistors of the first differential pair;
- wherein the negative feedback circuit includes operational amplifiers, each having a first input coupled to a terminal of the second resistor, a second input forming an input terminal, and an output coupled to the base of a transistor of the first differential pair; and
- wherein one of the operational amplifiers is formed by a further NPN transistor having a collector coupled to the high supply terminal through a current source and to the base of one of the transistors of the first differential pair, having an emitter coupled to a second input terminal and having a base coupled both to one of the first input terminals and to one of the terminals of the second resistor.

15. The circuit of claim 14, wherein the negative feedback circuit further includes a fifth resistor, and wherein the base of the further transistor is coupled to the one of the first input terminals via the fifth resistor.

16. The circuit of claim 9, wherein the third and fourth resistors have a same value that is equal to half the value of the second resistor.

17. A circuit for converting a voltage into a current difference, including:
- first differential pair means having input terminals and output terminals, for providing a current difference on the output terminals that is proportional to a voltage supplied on its input terminals, the first differential pair means having a pair of first current gains;
- second differential pair means coupled to the input terminals of the first differential pair means, the second differential pair means having a pair of second current gains; and
- voltage negative feedback means coupled to the input of the first differential pair means and to the second differential pair means, for applying the pair of second current gains to reduce an error caused by the first pair of current gains being of an insufficiently high value.

18. The circuit of claim 17 wherein the first differential pair means includes:
- first and second NPN transistors having emitters coupled to a low supply terminal through a current source, having collectors coupled to a high supply terminal, and having bases form the input terminals to the differential pair means, and
- a first resistor disposed between the emitters of the transistors of the first differential pair.

19. The circuit of claim 17 wherein the second differential pair means includes:
- first and second NPN transistors having emitters coupled to a low supply terminal through a current source and having collectors coupled to a high supply terminal,
- a first resistor disposed between the emitters of the transistors of the second differential pair, and
- second and third resistors disposed between the bases of the first and second transistors and the input terminals of the first differential pair.

20. The circuit of claim 19 wherein the voltage negative feedback means are coupled to the terminals of the first resistor in order to fix the voltage across the first resistor to a predetermined input voltage.

21. The circuit of claim 19, wherein the second and third resistors have a same value that is equal to half the value of the first resistor.

22. The circuit of claim 19, wherein the negative feedback means includes operational amplifiers, each having a first input coupled to a terminal of the first resistor, a second input forming a circuit input terminal, and an output coupled to one of the inputs of the first differential pair means.

23. The circuit of claim 19, wherein the first NPN transistor provides a first current gain, wherein the second NPN transistor further provides a second current gain, and wherein the voltage negative feedback means is also for applying the third current gain to reduce the impact of differences between the first pair of current gains on the relationship between the voltage at the input terminals of the first differential pair means and the current difference at the output terminals of the first differential pair means.

24. A circuit for converting an input voltage to a differential output current, comprising:
   first through fourth transistors, all of the same bipolar type, each having a base, an emitter, and a collector, the collectors of the first and fourth transistors supplying the differential output current;
   first through fourth current sources, one for each of the first through fourth transistors, respectively, each coupled between the emitter of one of the first through fourth transistors and a supply voltage;
   a first impedance coupled between the emitters of the first and fourth transistors;
   a second impedance coupled between the emitters of the second and third transistors;
   a third impedance coupled between the base of the first transistor and the base of the second transistor;
   a fourth impedance coupled between the base of the third transistor and the base of the fourth transistor; and
   a control circuit, coupled to the base of at least one of the first and fourth transistors, for establishing a voltage across the second impedance responsive to the input voltage.

25. The circuit of claim 24, wherein the control circuit is a feedback circuit that controls the voltage across the second impedance.

26. The circuit of claim 25, wherein the input voltage is differential and includes first and second input signals, and the feedback circuit comprises two independent feedback loops:
   a first feedback loop including a first control circuit receives the first input signal and drives the base of the first transistor to force a voltage at the emitter of the second transistor to follow the first input signal; and
   a second feedback loop including a second control circuit that receives the second input signal and drives the base of the fourth transistor to force a voltage at the emitter of the third transistor to follow the second input signal.

27. The circuit of claim 26, wherein the first control circuit is an operational amplifier.

28. The circuit of claim 26, wherein the second control circuit is an operational amplifier.

29. The circuit of claim 26, wherein the first control circuit comprises a fifth transistor having the same bipolar type of the first through fourth transistors, whose base is coupled to the emitter of the second transistor and whose collector is coupled to the base of the first transistor.

30. The circuit of claim 26, wherein the second control circuit comprises a sixth transistor having the same bipolar type of the first through fourth transistors, whose base is coupled to the emitter of the third transistor and whose collector is coupled to the base of the fourth transistor.

31. The circuit of claim 24, wherein third and fourth impedances each have a value that is substantially half the value of the second impedance.

32. The circuit of claim 24, fabricated as an integrated circuit.

33. The circuit of claim 24, wherein each of the first through fourth impedances is a resistor.

34. The circuit of claim 24, wherein each of the first through fourth transistors is of the NPN type.

35. A bipolar transistor circuit for generating an output current in response to an input voltage, including compensation for substantially eliminating a dependence of the output current on a transistor current gain alpha of the bipolar transistors making up the circuit, comprising:
   a first differential pair of bipolar transistors, the emitters of the transistors each being coupled to a supply voltage through a separate current source;
   first resistive means, bridging the emitters of the transistors of the first differential pair, for conducting a difference current responsive to a difference between the emitter currents of the transistors of the first differential pair;
   compensating means, coupled to the bases of the transistors of the first differential pair, for generating a compensation signal that varies inversely with alpha;
   a second differential pair of bipolar transistors, the bases of which being coupled to the compensating means, the emitters of which each being coupled to the supply voltage through a separate current source, and the collectors of which each providing a collector current, wherein a ratio of collector current to emitter current of the transistors of the second differential pair varies directly with alpha;
   second resistive means, bridging the emitters of the transistors of the second differential pair, for conducting a difference current responsive to a difference between the emitter currents of the transistors of the second differential pair; and
   means, coupled to the bases of the second differential pair, for establishing a predetermined voltage across the second resistive means, so that the inverse proportionality with alpha of the compensation signal substantially cancels out the direct proportionality with alpha of the ratio of collector current to emitter current of the transistors of the second differential pair, thereby substantially eliminating a dependence of the collector currents of the transistors of the second differential pair upon alpha.

36. The circuit of claim 35, wherein the means for establishing includes means, responsive to the input voltage, for controlling the voltage across the second resistive means using feedback.

37. The circuit of claim 36, wherein said means for controlling further comprises:
   means for sensing a voltage across the second resistive means;
   means for comparing the voltage across the second resistive means with the input voltage to generate an error signal; and
   means for driving the bases of the second differential pair in a manner that tends to reduce the error signal.

38. A method for reducing a dependence of an output current of a bipolar voltage-to-current converter upon a transistor current gain alpha, the bipolar voltage-to-current converter having a first differential pair of bipolar transistors, the emitters of which being coupled together through a first resistor, and having a second differential pair of bipolar transistors, the emitters of which being coupled together through a second resistor, the transistors of the first and second differential pair having the current gain alpha, the method comprising the steps of:

A) driving the bases of the transistors of the first differential pair to generate a voltage across the first resistor responsive to a difference between the emitter currents of the transistors of the first differential pair;

B) generating a compensating signal substantially equal to the voltage across the first resistor divided by alpha;

C) applying the compensating signal to an input of the second differential pair to generate a voltage across the second resistor responsive to a difference between the emitter currents of the transistors of the second differential pair, the collectors currents of the transistors of the second differential pair being directly proportional to the compensating signal times alpha, a ratio of the collector currents to the voltage across the first resistor thereby being substantially independent of alpha.

39. The method of claim 38, further comprising the step of:

D) controlling the voltage across the first resistor by applying feedback.

40. The method of claim 38, wherein the step B further includes generating a voltage that exceeds a voltage across the first resistor by an amount proportional to a base current of the transistors of the first differential pair.

* * * * *